United States Patent
Kim et al.

(10) Patent No.: US 12,553,712 B2
(45) Date of Patent: Feb. 17, 2026

(54) FOCUS OPTIMIZATION FOR WAFER WHICH HAS MULTI-PEAK FOCUS

(71) Applicant: SAMSUNG ELECTRONICS CO., LTD., Suwon-si (KR)

(72) Inventors: Jun Yeob Kim, Suwon-si (KR); Jin Ryeong Park, Hwaseong-si (KR); Sol Lee Hwang, Hwaseong-si (KR)

(73) Assignees: SAMSUNG ELECTRONICS CO., LTD., Suwon-si (KR); AUROS Technology, Inc, Hwaseong-si (KR)

( * ) Notice: Subject to any disclaimer, the term of this patent is extended or adjusted under 35 U.S.C. 154(b) by 208 days.

(21) Appl. No.: 18/386,941

(22) Filed: Nov. 3, 2023

(65) Prior Publication Data
US 2024/0377190 A1    Nov. 14, 2024

(30) Foreign Application Priority Data

May 8, 2023    (KR) .................. 10-2023-0059411

(51) Int. Cl.
*G01B 11/27*    (2006.01)

(52) U.S. Cl.
CPC .................. *G01B 11/272* (2013.01)

(58) Field of Classification Search
CPC ............. G01B 11/272; G03F 7/706849; G03F 7/70633; G03F 7/70653; G03F 7/70683; H01L 22/12; H01L 23/544; H01L 2223/54426
USPC .................. 356/138, 128, 399–401
See application file for complete search history.

(56) References Cited

U.S. PATENT DOCUMENTS

| | | | |
|---|---|---|---|
| 5,408,083 A | 4/1995 | Hirukawa et al. | |
| 6,094,223 A | 7/2000 | Kobayashi | |
| 9,939,623 B2 | 4/2018 | Chan et al. | |
| 10,763,146 B2 | 9/2020 | Volkovich et al. | |
| 11,340,060 B2 | 5/2022 | Li et al. | |
| 11,835,865 B2 | 12/2023 | Shin et al. | |
| 2008/0013073 A1* | 1/2008 | Kobayashi | G03F 9/7011 356/73 |

(Continued)

FOREIGN PATENT DOCUMENTS

| | | |
|---|---|---|
| JP | 2016-206281 A | 12/2016 |
| KR | 10-1714616 B1 | 4/2017 |

(Continued)

OTHER PUBLICATIONS

Communication dated Mar. 26, 2025, issued by the Korean Patent Office in Korean Application No. 10-2023-0059411.

*Primary Examiner* — Isiaka O Akanbi
(74) *Attorney, Agent, or Firm* — Sughrue Mion, PLLC

(57) ABSTRACT

An overlay measurement device includes: a light source configured to direct an illumination to an overlay measurement target in which a first overlay key formed in a first layer and a second overlay key formed in a second layer stacked on an upper portion of the first layer are positioned, a lens assembly having an objective lens and a lens focus actuator, a detector configured to obtain a focus image, and a controller configured to control the lens assembly to acquire depth-specific focus images of the overlay measurement target, extract a plurality of candidate focuses from the acquired depth-specific focus images, and select an optimal focus by applying predetermined parameter to the plurality of candidate focuses.

14 Claims, 7 Drawing Sheets

(56) References Cited

U.S. PATENT DOCUMENTS

2022/0035258 A1* 2/2022 Lee .................... G02B 27/0955
2022/0326008 A1* 10/2022 Park .................... G03F 7/70633
2023/0324811 A1* 10/2023 Shin .................. G03F 7/706851

FOREIGN PATENT DOCUMENTS

| KR | 10-2273278 B1 | 7/2021 |
| KR | 10-2524462 B1 | 4/2023 |

* cited by examiner

FOCUS OPTIMIZATION FOR WAFER WHICH HAS MULTI-PEAK FOCUS

CROSS-REFERENCE TO RELATED APPLICATIONS

This application is based on and claims priority to Korean Patent Application No. 10-2023-0059411, filed on May 8, 2023, in the Korean Intellectual Property Office, the disclosure of which is incorporated by reference herein in its entirety.

BACKGROUND

1. Field

Example embodiments of the disclosure relate to a device and a method for measuring an overlay of a wafer, and more particularly, to a focus optimization for a wafer which has a multi-peak focus in the device.

2. Description of Related Art

As technology further develops, a size of a semiconductor device is decreasing, whereas the density of an integrated circuit formed on a wafer is increasing. In order to form the integrated circuit on the wafer, many manufacturing processes may be performed such that a desired circuit structure and desired circuit elements are sequentially formed at specific locations. In such a manufacturing process, patterned layers may be sequentially generated on the wafer.

Through the repeated lamination processes, electrically activated patterns may be formed in the integrated circuit. In this case, if respective structures are not aligned within an error range permitted in a production process, an inference may occur between the electrically activated patterns, and there may be a problem in performance and reliability of the integrated circuit due to such a phenomenon. In order to measure and verify an alignment error between layers, an overlay measurement device may be used, in which a focal position is found through contrast or a phase difference in an image for the wafer.

However, when the alignment error is measured using the overlay measurement device while the focus is changed in each layer in the wafer, there is a layer in which there are multiple focuses well expressing the image. In other words, there is layer with several focuses of high-contrast, and if the wafer is measured with a focus determined by conventional methods on a wafer on which two or more layers or patterns are stacked, the image is not clearly visible in two or more layers.

SUMMARY

Embodiments provide an overlay measurement device and an overlay measurement method including a focus optimization method on a wafer with a multi-peak focus, which can find an optimal focal distance by determining an optimal focus in a wafer in which there layers with several points with a high-contrasting focus are stacked.

According to an aspect of an embodiment, an overlay measurement device includes: a light source configured to direct an illumination on an overlay measurement target in which a first overlay key formed in a first layer and a second overlay key formed in a second layer are positioned, the second layer being stacked on an upper portion of the first layer; a lens assembly including: an objective lens configured to condense the illumination on a measurement position of at least one point in the overlay measurement target; and a lens focus actuator configured to control a distance between the objective lens and the overlay measurement target; a detector configured to acquire a focus image at the measurement position based on a beam reflected on the measurement position; and a controller configured to: control the lens assembly to obtain depth-specific focus images of the overlay measurement target by changing a depth of the overlay measurement target according to a set value, extract a plurality of candidate focuses based on a maximum contrast index of the overlay measurement target from the depth-specific focus images of the overlay measurement target, and select an optimal focus based on statistical values in which a parameter is applied to the plurality of candidate focuses.

According to an aspect of an embodiment, an overlay measurement method includes: repeatedly measuring an overlay measurement target in which a first overlay key formed in a first layer and a second overlay key formed in a second layer stacked on an upper portion of the first layer are positioned, and obtaining depth-specific focus images of the first overlay key and depth-specific focus images of the second overlay key; extracting a plurality of candidate focuses by determining maximum contrast indexes of the first overlay key and the second overlay key in the depth-specific focus images of the first overlay key and the depth-specific focus images of the second overlay key, and selecting an optimal focus by applying a parameter to the plurality of candidate focuses.

According to an aspect of an embodiment, a non-transitory, computer-readable storage medium stores instructions that, when executed by at least one processor, cause the at least one processor to perform an overlay measurement method including: repeatedly measuring an overlay measurement target in which a first overlay key formed in a first layer and a second overlay key formed in a second layer stacked on an upper portion of the first layer are positioned, and obtaining depth-specific focus images of the first overlay key and depth-specific focus images of the second overlay key; extracting a plurality of candidate focuses by determining maximum contrast indexes of the first overlay key and the second overlay key in the depth-specific focus images of the first overlay key and the depth-specific focus images of the second overlay key, and selecting an optimal focus by applying a parameter to the plurality of candidate focuses.

BRIEF DESCRIPTION OF THE DRAWINGS

The above and other aspects, features, and advantages of certain example embodiments of the present disclosure will be more apparent from the following description taken in conjunction with the accompanying drawings, in which.

DETAILED DESCRIPTION

Figure 1:
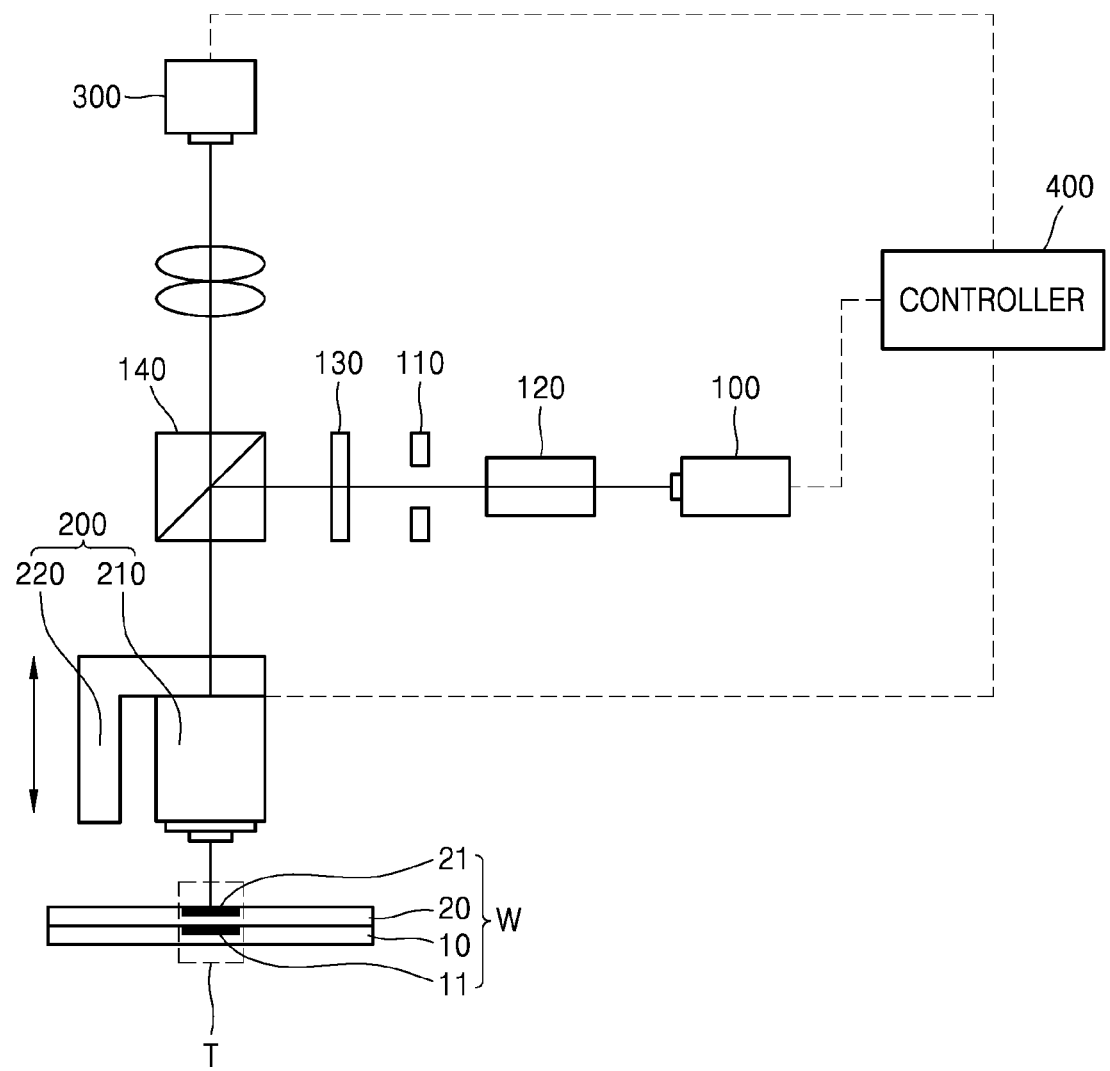
FIG. 1 is a diagram schematically illustrating an overlay measurement device according to an embodiment of the disclosure.

Hereinafter, example embodiments of the disclosure will be described in detail with reference to the accompanying drawings.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The example embodiments of the disclosure are provided to explain the present invention more completely to those skilled in the art, and the following embodiments may be transformed into several different forms, and the scope of the disclosure is not limited to the following embodiments. On the contrary, the example embodiments are provided to be further and complete, and to fully convey the ideas of the disclosure to those skilled in the art. In addition, the thickness and size of each layer in the drawing is exaggerated for the convenience and clarity of the description.

In the drawings, for example, according to the manufacturing technology and/or tolerance, the deformation of the shown shape may be expected. Accordingly, an embodiment of the disclosure is not interpreted as limited to a specific shape of the area shown herein, and should include, for example, a change in the shape caused by the manufacture.

As shown in FIG. 1, an overlay measurement system is a system that measures an error between a first overlay key 11 and a second overlay key 21 formed on different layers, respectively, which are formed in a wafer W.

For example, the first overlay key 11 may be an overlay mark formed on a previous layer, and the second overlay key 21 may be an overlay mark formed on a current layer. The overlay mark is formed on a scribe line while a layer for forming a semiconductor device is formed in a die area. For example, the first overlay key 11 may be formed jointly with an insulating film pattern, and the second overlay key 21 may be formed jointly with a photoresist pattern formed on the insulating film pattern. In this case, the second overlay key 21 is exposed to the outside, but the first overlay key 11 is covered by a photoresist layer, and may be made of an oxide having a different optical property from the second overlay key 21 made of a photoresist material.

Further, physical positions of the first overlay key 11 and the second overlay key 21 may be different from each other, but focus surfaces may be the same as or different from each other.

Embodiments of the disclosure provide an overlay measurement device and an overlay measurement method including a focus optimization method in a wafer with a multi-peak focus.

Figure 2:
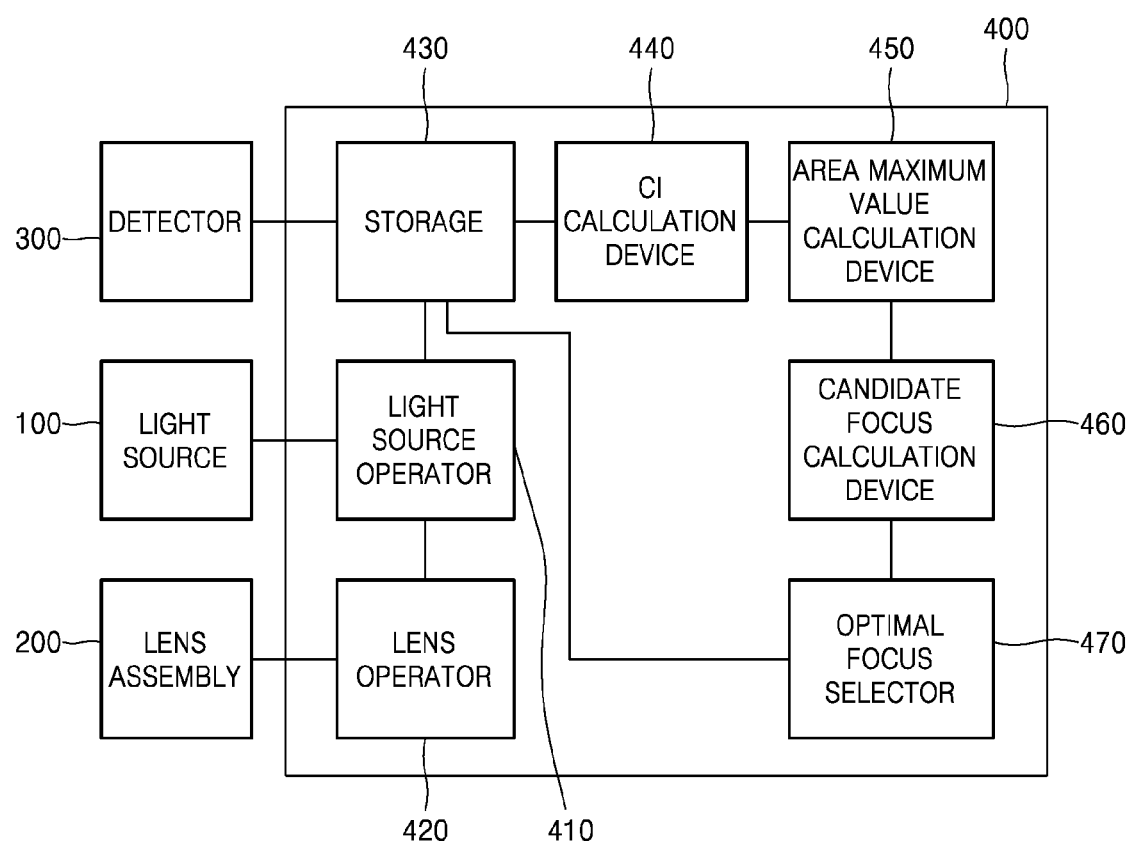
FIG. 2 is a diagram illustrating a controller of the overlay measurement device according to an embodiment of the disclosure.
Figure 3:
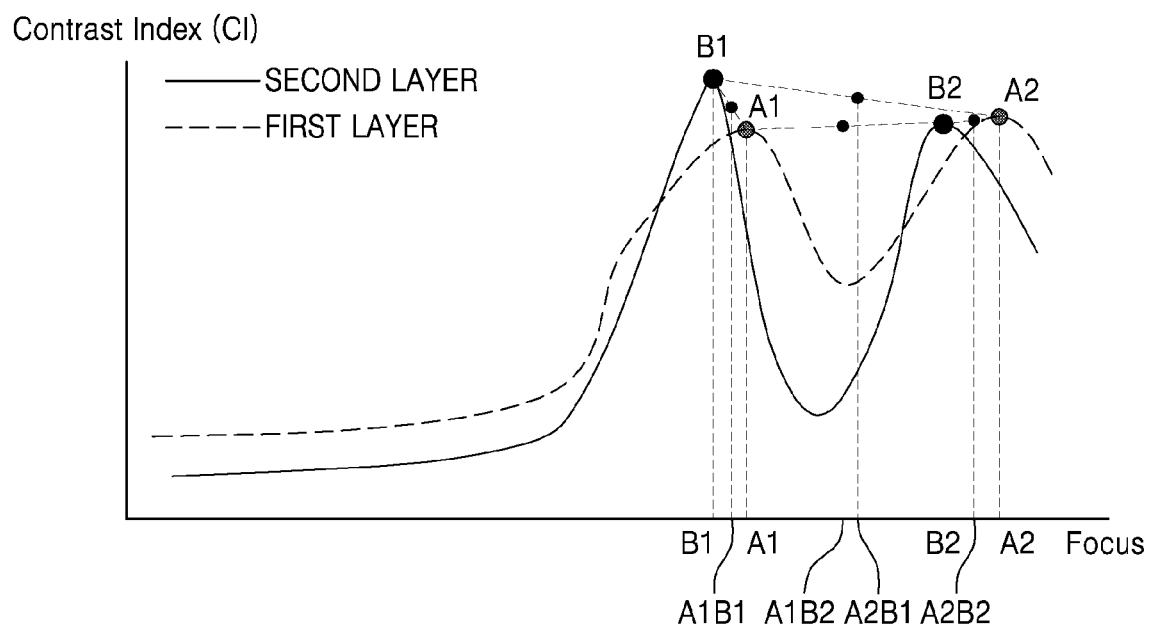
FIG. 3 is a graph illustrating a contrast index for a focus of an overlay measurement target measured by the overlay measurement device according to an embodiment of the disclosure.

FIG. 1 is a diagram schematically illustrating an overlay measurement device according to an embodiment of the disclosure, FIG. 2 is a diagram illustrating a controller 400 of the overlay measurement device of FIG. 1 according to an embodiment of the disclosure, and FIG. 3 is a graph illustrating a contrast index for a focus of an overlay measurement target measured by the overlay measurement device according to an embodiment of the disclosure.

First, according to an embodiment, the overlay measurement device may generally include a light source 100, a lens assembly 200, a detector 300, and a controller 400.

As illustrated in FIG. 1, an illumination may be directed from at least one illumination source to an overlay measurement target T. Specifically, the light source 100 may be configured to direct the illumination to the overlay measurement target T at which the first overlay key 11 formed in a first layer 10 and the second overlay key 21 formed in a second layer 20 stacked on an upper portion of the first layer 10 are positioned.

For example, the light source 100 may be formed as a halogen lamp, a xenon lamp, a supercontinuum laser, a light emitting diode, a laser inducted lamp, etc., and may include various wavelengths such as ultraviolet (UV), visible ray, or infrared rays (IR), etc., and is not limited thereto.

According to an embodiment, the overlay measurement device may include a stop 110, a spectrum filter 120, a polarization filter 130, and a beam splitter 140.

The stop 110 may be formed as an opaque plate with an opening through which light passes, and a beam irradiated by the light source 100 may be changed to a form suitable for shooting the first overlay key 11 and the second overlay key 21.

The stop 110 may include at least one of an aperture stop for controlling the amount of light and a field stop for controlling a focusing scope of an image, and may be formed between the light source 100 and the beam splitter 140 as illustrated in FIG. 1, and formed between the beam splitter 140 and the lens assembly 200.

The spectrum filter 120 may control a center wavelength and a bandwidth of the beam radiated by the light source 100 to be suitable for acquiring the images of the first overlay key 11 and the second overlay key 21 formed in the overlay measurement target T. For example, the spectrum filter 120 may be formed as at least one of a filter wheel, a linear translation device, a flipper device, and a combination thereof.

The beam splitter 140 transmits a part of the beam output from the light source 100, and then passing through the stop 110, and reflects a part and separates the beam output from the light source 100 into two beams.

As illustrated in FIG. 1, the lens assembly 200 may have an objective lens 210 that condenses the illumination at a measurement position at any one point in the overlay measurement target T and a lens focus actuator 220 that controls a distance between the objective lens 210 and the overlay measurement target T.

The objective lens 210 may condense the beam reflected on the beam splitter 140 on measurement positions in which the first overlay key 11 and the second overlay key 21 are formed in the wafer W, and collect the reflected beam.

The objective lens 210 may be installed in the lens focus actuator 220.

The lens focus actuator 220 controls a distance between the objective lens 210 and the wafer W to control a focal surface to be positioned in the first overlay key 11 or the second overlay key 21.

The lens focus actuator 220 may control a focal distance by vertically moving the objective lens 210 toward the wafer W by the control of the controller 400.

In this case, the measurement position as at least any one point of the overlay measurement target T may be positioned in the first layer 10 or the second layer 20, and may formed between the first overlay key 11 and the second overlay key 21. Further, the measurement position may include all depths for each step according to driving of the lens focus actuator 220.

As illustrated in FIG. 1, the detector 300 may acquire a focus image at the measurement position based on the beam reflected at the measurement position.

The detector 300 captures a beam output by passing the beam reflected on the overlay measurement target T through the beam splitter 140 to acquire the images of the first overlay key 11 and the second overlay key 21.

The detector 300 may include an optical detector which may measure the beam reflected on the overlay measurement target T, and the optical detector may include, for example, a charge-coupled device (CCD) converting light into a charge to extract the image, a complementary metal-oxide-semiconductor (CMOS) sensor which is one integrated circuit, a photomultiplier tube (PMT) measuring the light, an avalanche photodiode (APD) array as an optical detection device, or various sensors generating or capturing the image.

The detector 300 may include a filter, a polarizer, and a beam block, and further include an arbitrary collection optical component for collecting the illumination collected by the objective lens 210.

As illustrated in FIG. 1, the controller 400 may control directing of the illumination radiated by the light source 100, and control the lens assembly 200 to condense the illumination in the overlay measurement target T and collect the reflected beam, and control the detector 300 to acquire the focus image measured through the reflected beam collected by the lens assembly 200.

For example, the controller 400 may control the lens assembly 200 to acquire the depth-specific focus images of the overlay measurement target T by changing the depth of the overlay measurement target T according to a predetermined set value.

The controller 400 may include an auto recipe optimization (ARO) program that automatically optimizes an overlay measurement recipe through filter optimization information, stop optimization information, focus optimization information, and pin-hole optimization information.

In this case, the focus optimization information automatically determines a focus optimization option based on light source operation information, lens operation information, image information, contrast index (CI) information, area maximum value information, candidate focus information, focus selection information, etc., to automatically select an optimal focus capable of detecting the images of the first overlay key 11 and the second overlay key 21.

For example, the controller 400 extracts a plurality of candidate focuses through a maximum contrast index of the overlay measurement target T in the depth-specific focus images of the acquired overlay measurement target T, and grants a weight to the plurality of candidate focuses to select the optimal focus.

Specifically, as shown in FIG. 2, the controller 400 may include a light source operator 410, a lens operator 420, a storage 430, a CI calculation device 440, an area maximum value calculation device 450, a candidate focus calculation device 460, and an optimal focus selector 470.

As illustrated in FIG. 2, the light source operator 410 may control directing of the illumination radiated by the light source 100, and the lens operator 420 may control an operation of the lens focus actuator 220 to condense the illumination in the overlay measurement target T and acquire the focus images of the first layer 10 and the second layer 20 by depth according to the set value.

The set value is a depth-specific movement value for moving the lens assembly 200 so as to measure the image for the overlay measurement target T in various depths. That is, the lens assembly 200 moves according to the set value, and the focus for the overlay measurement target T may be changed for each depth.

As illustrated in FIG. 2, the storage 430 may store the depth-specific focus images of the first overlay key 11 and the depth-specific focus images of the second overlay key 21 acquired by the detector 300 according to the set value.

For example, the lens operator 420 controls the lens focus actuator 220 so that an interval between the objective lens 210 and the overlay measurement target T repeatedly moves by the set value, and as a result, the storage 430 may acquire and store the depth-specific focus images of the first overlay key 11 and the depth-specific focus images of the second overlay key 21 according to respective depths having a predetermined difference, i.e., a depth difference which is as large as the set value.

In this case, the lens focus actuator 220 may move while the depth-specific focus images of the first overlay key 11 and the depth-specific focus images of the second overlay key 21 are simultaneously acquired, or the lens focus actuator 220 may primarily move in order to acquire the depth-specific focus images of the first overlay key 11 and the lens focus actuator 220 may secondarily move in order to acquire the depth-specific focus images of the second overlay key 21.

As illustrated in FIG. 2, the CI calculation device 440 may determine a contrast index (CI) according to the depth-specific focus images of the first overlay key 11 and the depth-specific focus images of the second overlay key 21.

Specifically, the CI calculation device 440 may acquire focus-contrast index information storing contrast indexes for respective focuses from the depth-specific focus images of the first overlay key 11 and the depth-specific focus images of the second overlay key 21.

For example, the focus-contrast index information as data including the depth-specific focus images of the first overlay key 11 and the respective contrast indexes may be expressed as a graph illustrated in FIG. 3 by connecting the contrast index according to the depth-specific focus images of the first overlay key 11.

In this case, the CI as the contrast index may mean an overall contrast degree of an image pixel value, and may be a value representing how the image is clear.

The focus-contrast index information as the depth-specific focus images may not be expressed as a continuous graph, or may be corrected with a continuous graph by applying various elements.

As illustrated in FIG. 2, the area maximum value calculation device 450 may determine each of area maximum values A1 and A2 of the first overlay key and area maximum values B1 and B2 of the second overlay key from the focus-contrast index information.

Specifically, the area maximum value calculation device 450 may determine the area maximum values A1 and A2 of the first overlay key and the area maximum values B1 and B2 of the second overlay key in which a slope in a specific area becomes 0 from the contrast index according to the depth-specific focus images of the first overlay key 11 and the depth-specific focus images of the second overlay key 21 determined by the CI calculation device 440.

The area maximum value calculation device 450 determines a focus having a largest CI value in a predetermined area in respect to the area maximum value in the depth-specific focus images of the first overlay key 11 and the second overlay key 21, and for example, when CI values of the focus before and after the CI value of a specific area are compared, the CI value of the specific area in which the CI value increases from a previous focus of the specific area to the specific area and when the specific area is passed, the CI value decreases may become the area maximum value, and the area maximum value calculation device 450 may determine the CI value of the specific area.

That is, the area maximum value calculation device 450 may determine a CI value in which the slope is 0, which is a point where the slope is changed from a positive number to a negative number in the graph representing the focus-contrast index information.

More specifically, for example, as illustrated in FIG. 3, the area maximum value of the first layer 10 may be determined as A1 and A2 in which the slope becomes 0 and the area maximum value of the second layer 20 may be determined as B1 and B2.

The area maximum value calculation device 450 compares maximum values at respective preset predetermined intervals to determine the area maximum value or determine a focus having a value equal to or larger than a preset CI value as the area maximum value, and besides, determine the area maximum value by various methods.

As illustrated in FIG. 2, the candidate focus calculation device 460 determines an average value of the area maximum value of the first overlay key and the area maximum value of the second overlay key to determine a matching average value, and determine the matching average value, the area maximum value of the first overlay key and the area maximum value of the second overlay key as candidate focuses.

The area maximum value of the first overlay key may include at least one of A1, A2, . . . , An, and the area maximum value of the second overlay key may include at least one of B1, B2, . . . , Bm.

The matching average value may be shown as the multiple of the number m of area maximum values of the second overlay key in the number n of area maximum values of the first overlay key, and each of the area maximum value of the first overlay key, An, the area maximum value of the second overlay key, Bm, and the matching average value AnBm may be one or more, and the candidate focus may include three or more.

For example, as illustrated in FIG. 3, the candidate focus calculation device 460 may determine the area maximum values A1 and A2 of the first overlay key, the area maximum values B1 and B2 of the second overlay key, and the matching average values A1B1, A1B2, A2B1, and A2B2 as the candidate focuses.

As illustrated in FIG. 2, the optimal focus selector 470 determines statistical values acquired by applying parameter to the respective candidate focuses, and grants weights to the respective statistical values to determine a candidate focus in which the sum of the statistical values becomes the minimum as the optimal focus.

Specifically, the optimal focus selector 470 may determine statistical values acquired by applying parameter to the area maximum value of the first overlay key, the area maximum value of the second overlay key, and the matching average value.

For example, the respective statistical values may be determined by applying the parameter to respective focus images having the area maximum value of the first overlay key, the area maximum value of the second overlay key, and the matching average value.

In this case, the parameter may include at least one of Final Residual 3 Sigma, TIS 3 Sigma, Registration 3 Sigma, Total Measurement Uncertainty (TMU) indicating measurement precision, Move and Measure (MAM) time indicating a measurement time after inter-measurement movement, and a combination thereof.

Subsequently, the optimal focus selector 470 may grant the weights to the statistical values to which the parameter are applied, respectively, and select a focus in which the sum of result values to which the weights are granted becomes the minimum.

For example, the optimal focus selector 470 may select a smallest value as the optimal focus by adding all values acquired by multiplying the respective statistical values by the weights. Therefore, the optimal focus may be found based on a parameter having a high importance through the weight.

The weight may be set by a user, or set to a default value stored in a program, and the sum of weights of used parameter among the parameter is based on 100.

A series of processes performed by the controller 400 may include a display unit so as to be monitored by the user, and may include an input unit which may be directly controlled by the user.

That is, the images of the overlay measurement target T determined by the storage 430, the CI calculation device 440, the area maximum value calculation device 450, the candidate focus calculation device 460, and the optimal focus calculation device 470, the graph expressing the focus-contrast index information, the CI value, the candidate focus, and the optimal focus may be confirmed through the display unit, and the user may directly control the light source operator 410 and the lens operator 420 through the input unit, or the image of the overlay measurement target T, the graph expressing the focus-contrast index information, the CI value, the candidate focus, and the optimal focus may be directly selected, changed, and determined.

The overlay measurement device may include a memory storing instructions, programs, logic, etc., for controlling operations of respective components of the overlay measurement device by the controller 400, and the components may be added, changed, or deleted as necessary.

That is, by the overlay measurement device according to an embodiment of the disclosure, the depth-specific focus images may be measured in the wafer including two or more layers, and the optimal focus may be selected, and as a result, measurement accuracy can be increased and worker's man-hour can be reduced. Further, for an optimization result which is largely influenced by an individual ability of a worker, it is possible to derive a consistent result by data based automatic optimization.

FIGS. 4, 5, 6, and 7 are diagrams illustrating an overlay measurement method according to an embodiment of the disclosure.

Figure 4:
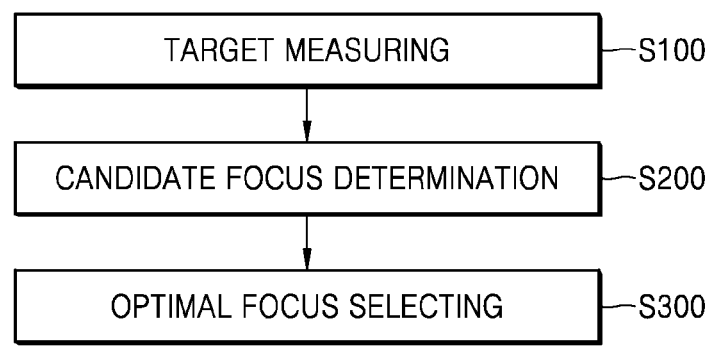
FIGS. 4, 5, 6, and 7 are diagrams illustrating an overlay measurement method according to an embodiment of the disclosure.

As illustrated in FIG. 4, according to an embodiment, the overlay measurement method may include a target measuring step S100, a candidate focus determining operation S200, and an optimal focus selecting step S300.

As illustrated in FIG. 4, the target measuring step S100 is a step of repeating measurement of an overlay measurement target T in which a first overlay key 11 formed in a first layer 10 and a second overlay key 21 formed in a second layer 20 stacked at an upper portion of the first layer 10 are positioned to acquire depth-specific focus images of the first overlay key 11 and depth-specific focus images of the second overlay key 21.

Figure 5:
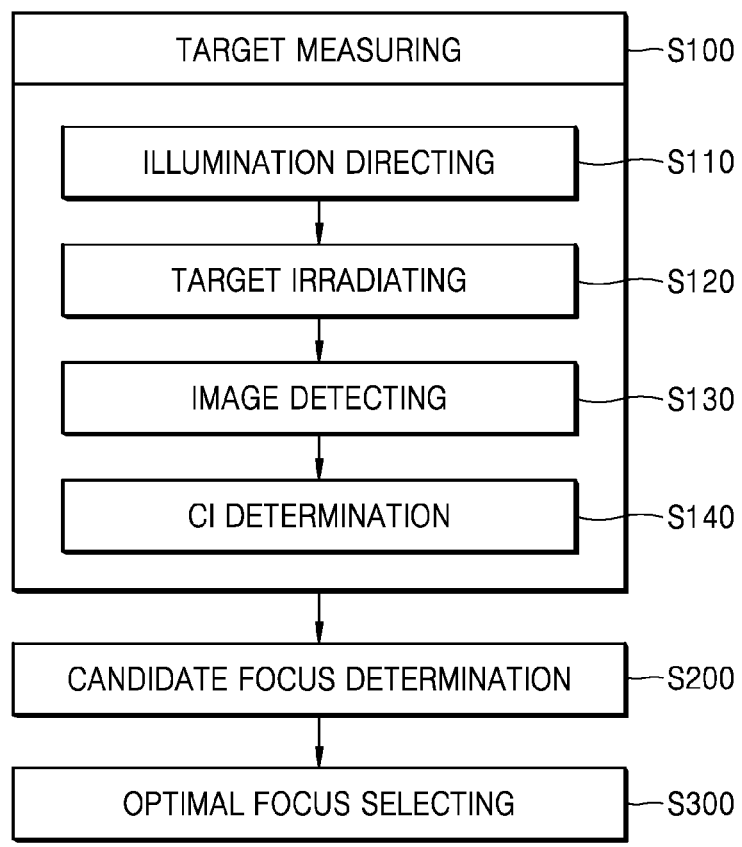

Specifically, as illustrated in FIG. 5, the target measuring operation S100 may include an illumination directing operation S110, a target irradiating operation S120, an image detecting operation S130, and a CI determining operation S140.

The illumination directing operation S110 directs an illumination of a light source 100 to the overlay measurement target T.

In the illumination directing operation S110, the illumination may be directed to the overlay measurement target T in which the first overlay key 11 and the second overlay key 21 are positioned from the light source 100.

The target irradiating operation S120 controls a lens focus actuator 220 controlling a distance between an objective lens 210 and the overlay measurement target T to condense the illumination on a measurement position at any one point in the overlay measurement target T through the lens assembly 200.

The target irradiating operation S120 is controls a focal distance by vertically moving the objective lens 210 toward a wafer W by the lens focus actuator 220 by the control of the controller 400, and condensing a beam reflected on a beam splitter 140 on measurement positions in which the first overlay key 11 and the second overlay key 21 of the wafer W are formed by the objective lens 210.

For example, in the target irradiating operation S120, the beam directed in the illumination directing operation S110 may be condensed on the measurement position formed between the first overlay key 11 and the second overlay key 21 according to driving of the lens focus actuator 220.

The image detecting operation S130 acquires a focus image at the measurement position through the beam reflected on the measurement position by the detector 300.

In the image detecting operation S130, the beam passing through the beam splitter 140 may be detected, and images of the first overlay key 11 and the second overlay key 21 may be acquired and stored in the storage 430.

In this case, in the target measuring operation S100, a depth of the overlay measurement target T may be changed according to a predetermined set value, and the target irradiating operation S120 and the image detecting operation S130 may be repeated.

For example, as illustrated in FIG. 5, in the target irradiating operation S120, the lens focus actuator 220 may be controlled so that an interval between the objective lens 210 and the overlay measurement target T repeatedly moves by the set value, and as a result, the depth-specific focus images of the first overlay key 11 and the depth-specific focus images of the second overlay key 21 may be detected at respective depths having a predetermined difference.

In this case, the depth-specific focus images of the first overlay key 11 and the depth-specific focus images of the second overlay key 21 may be simultaneously acquired while repeating the target irradiating operation S120 and the image detecting operation S130, or the target irradiating operation S120 and the image detecting operation S130 may be primarily repeated in order to acquire the depth-specific focus images of the first overlay key 11 and secondarily repeated in order to acquire the depth-specific focus images of the second overlay key 21.

The CI determining operation S140 is determines focus-contrast index information storing contrast indexes for respective focuses from the depth-specific focus images of the first overlay key 11 and the depth-specific focus images of the second overlay key 21.

In the CI determining operation S140, the focus-contrast index information may be expressed by the graph through depth-specific focal positions of the first overlay key 11 and the second overlay key 21 and the respective determined contrast indexes.

As illustrated in FIG. 4, the candidate focus determining operation S200 extracts a plurality of candidate focuses by determining maximum contrast indexes of the first overlay key 11 and the second overlay key 21 in the depth-specific focus images of the first overlay key 11 and the depth-specific focus images of the second overlay key 21 which are acquired.

The candidate focus determining operation S200 determines at least one area maximum value An of the first overlay key, at least one area maximum value Bm of the second overlay key, and at least one matching average value AnBm as candidate focuses.

Figure 6:
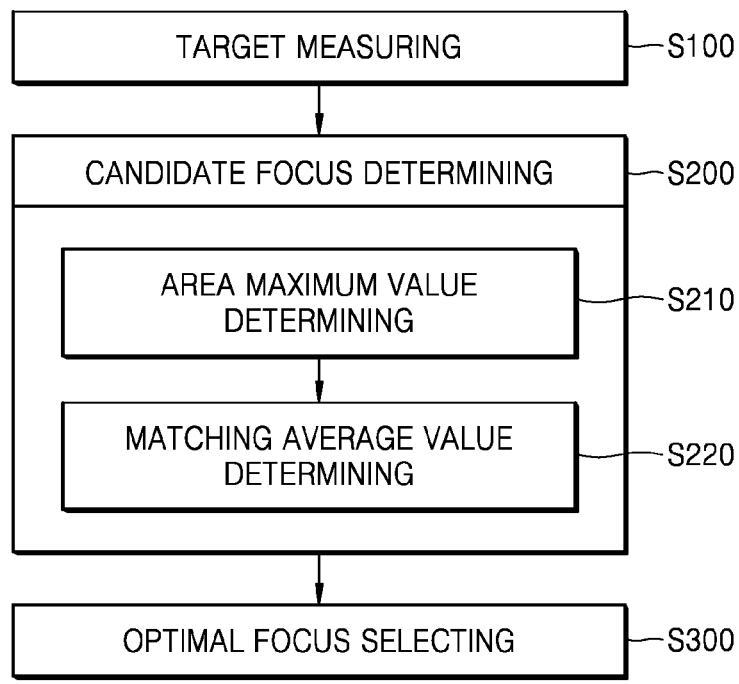

Specifically, as illustrated in FIG. 6, the candidate focus determining operation S200 may include an area maximum value determining operation S210 and a matching average value determining operation S220.

In the area maximum value determining operation S210, each of the area maximum value An of the first overlay key and the area maximum values Bm of the second overlay key may be calculated from the focus-contrast index information.

Specifically, the area maximum value determining operation S210 determines the area maximum value An of the first overlay key and the area maximum value Bm of the second overlay key in which a slope in a specific area becomes 0 from the contrast index according to the depth-specific focus images of the first overlay key 11 and the depth-specific focus images of the second overlay key 21.

For example, in the area maximum value determining operation S210 as a step of determining a focus having a largest CI value in a predetermined area in the depth-specific focus images of the first overlay key 11 and the second overlay key 21, for example, when the CI values of the focuses before and after the CI value of the specific area are compared, a focus in which the CI value in the specific area becomes the area maximum value may be determined.

Alternatively, maximum values are compared at respective preset predetermined intervals to determine the area maximum value or determine a focus having a value equal to or larger than a preset CI value as the area maximum value, and besides, the area maximum value may be determined by various methods.

In this case, the area maximum value of the first overlay key may include at least one of A1, A2, . . . , An, and the area maximum value of the second overlay key may include at least one of B1, B2, . . . , Bm.

The matching average value determining operation S220 determines at least one average value of the area maximum value An of the first overlay key and the area maximum value Bm of the second overlay key.

Specifically, in the matching average value determining operation S220, the average of the area maximum value An of the first overlay key and the area maximum value Bm of the second overlay key is determined to acquire a matching average value.

The matching average value may be shown as the multiple of the number m of area maximum values of the second overlay key in the number n of area maximum values of the first overlay key. In this case, when the matching average value is duplicated, the matching average value may be smaller than the multiple of the number m of area maximum values of the second overlay key in the number n of area maximum values of the first overlay key.

Therefore, in the candidate focus determining operation S200, the area maximum value An of the first overlay key, the area maximum value Bm of the second overlay key, and the matching average value AnBm may be determined as candidate focuses, and the candidate focuses may include three or more.

As illustrated in FIG. 4, the optimal focus selecting S300 selects the optimal focus by granting weights to the plurality of candidate focuses, and specifically, the optimal focus selecting operation S300 determines statistical values acquired by applying parameter to the respective candidate focuses, and grants weights to the respective statistical values to determine a candidate focus in which the sum of the statistical values becomes the minimum as the optimal focus.

Figure 7:
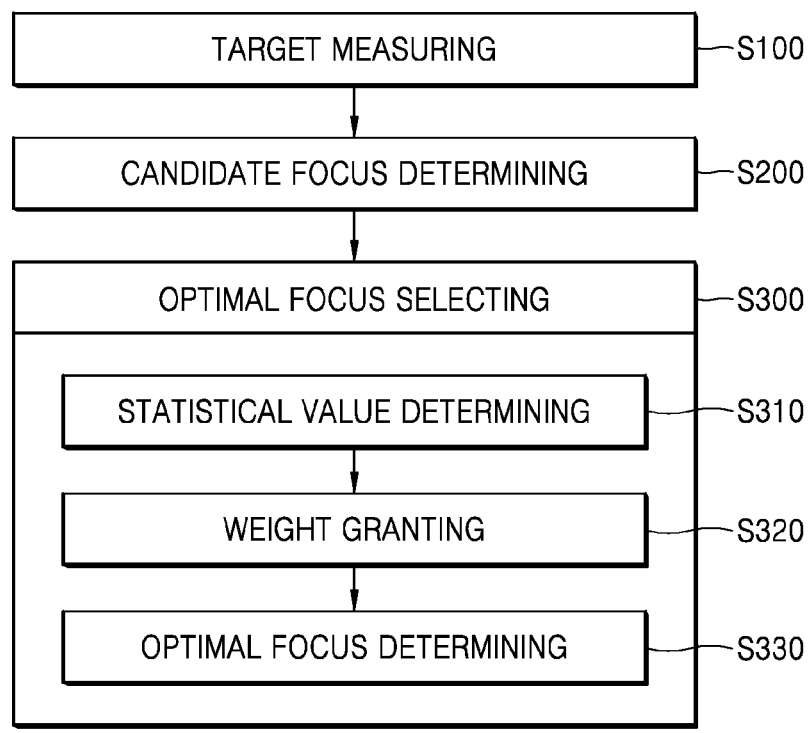

As illustrated in FIG. 7, the optimal focus selecting operation S300 may include a statistical value determining operation S310, a weight granting operation S320, and an optimal focus determining operation S330.

In the statistical value determining operation S310, the respective statistical values may be determined by applying the parameter to respective focus images having the area maximum value of the first overlay key, the area maximum value of the second overlay key, and the matching average value. For example, in the statistical value determining operation S310, statistical values for the respective candidate focuses may be determined by applying parameter including at least one of Final Residual 3 Sigma, TIS 3 Sigma, Registration 3 Sigma, Total Measurement Uncertainty (TMU) indicating measurement precision, Move and Measure (MAM) time indicating a measurement time after inter-measurement movement to the plurality of candidate focuses, and a combination thereof.

The weight granting operation S320 grants a predetermined weight to the respective statistical values, and subsequently, the optimal focus determining operation S330 determines a value in which the sum of the statistical values to which the weights are granted becomes the minimum as the optimal focus.

As a result, by the overlay measurement method according to an embodiment of the disclosure, the depth-specific focus images may be measured, and an optimal focus capable of measuring all of two or more overlay keys may be selected.

Figure 8:
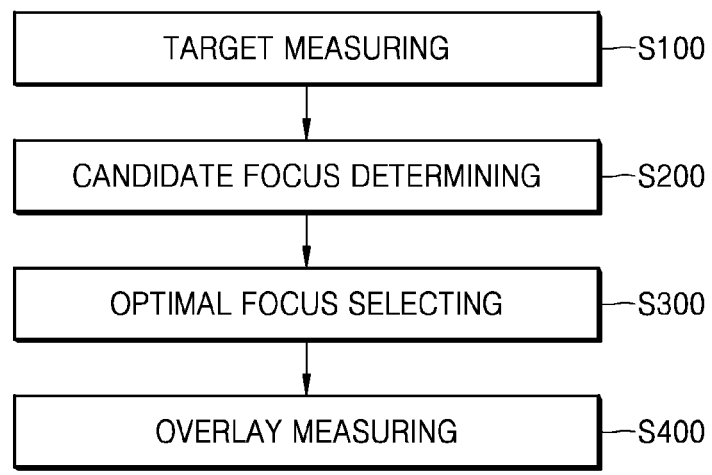
FIG. 8 is a diagram illustrating an overlay measurement method according to an embodiment of the disclosure.

FIG. 8 is a diagram illustrating an overlay measurement method according to an embodiment of the disclosure.

As illustrated in FIG. 8, according to an embodiment, the overlay measurement method may include a target measuring operation S100, a candidate focus determining operation S200, an optimal focus selecting operation S300, and an overlay measuring operation S400.

The target measuring operation S100, the candidate focus determining operation S200, an optimal focus selecting operation S300 are the same as those in the overlay measurement method.

The overlay measuring operation S400 measures the first overlay key 11 and the second overlay key 21 formed on a plurality of scribe lines with the optimal focus selected in the optimal focus selecting operation S300.

By the overlay measurement device and the overlay measurement method according to embodiments of the disclosure, the depth-specific focus images may be measured in the wafer including two or more layers, and the optimal focus is selected to measure the wafer with the optimal focus, and as a result, measurement accuracy can be increased and the mount of man hours of a worker can be reduced. Further, for an optimization result which is largely influenced by an individual ability of a worker, it is possible to derive a consistent result by data based automatic optimization.

In particular, even when a CI value distribution for the focus is peculiar, a user does not directly edit a recipe, but can optimize the recipe through an overlay measurement device of the disclosure. Of course, the scope of the disclosure is not limited by such an effect.

Various embodiments as set forth herein may be implemented as software including one or more instructions that are stored in a storage medium that is readable by a machine. For example, a processor of the machine may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store, or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The computer readable storage medium includes various recording devices storing data which may be deciphered by a computer system.

Examples of the computer readable storage medium include a server computer, and a read-only memory (ROM), a random access memory (RAM), a CD-ROM, a magnetic tape, a floppy disk, a magneto-optic disk, an optical data storage device, a flash memory, a universal serial bus (USB) memory, and the like and may also include a device implemented as a type of a carrier wave (e.g., transmission through the Internet).

The computer readable storage medium may store and execute codes which may be distributed in the computer system connected through a network and read by a computer in a distribution method.

The present disclosure has been described with reference to the exemplary embodiment illustrated in the drawings, but this is just exemplary and it will be appreciated by those skilled in the art that various modifications and other embodiments equivalent thereto can be made therefrom. Accordingly, the true technical scope of the disclosure should be defined by the technical spirit of the appended claims.

What is claimed is:

1. An overlay measurement device comprising:
    a light source configured to direct an illumination to an overlay measurement target in which a first overlay key formed in a first layer and a second overlay key formed in a second layer are positioned, the second layer being stacked on an upper portion of the first layer;
    a lens assembly comprising:
        an objective lens configured to condense the illumination on a measurement position of at least one point in the overlay measurement target; and
        a lens focus actuator configured to control a distance between the objective lens and the overlay measurement target;
    a detector configured to acquire a focus image at the measurement position based on a beam reflected on the measurement position; and
    a controller configured to:
        control the lens assembly to obtain depth-specific focus images of the overlay measurement target by changing a depth of the overlay measurement target according to a set value,
        extract a plurality of candidate focuses based on a maximum contrast index of the overlay measurement target from the depth-specific focus images of the overlay measurement target, and
        select an optimal focus based on statistical values in which a parameter is applied to the plurality of candidate focuses,
    wherein the controller is further configured to:
        obtain focus-contrast index information storing contrast indexes for respective focuses based on the depth-specific focus images of the first overlay key and the depth-specific focus images of the second overlay key,
        determine each of at least one area maximum value of the first overlay key and at least one area maximum value of the second overlay key in the focus-contrast index information,
        determine at least one matching average value by determining at least one average value of the area maximum value of the first overlay key and the area maximum value of the second overlay key, and
        determine the statistical values obtained by applying the parameter to the area maximum value of the first overlay key, the area maximum value of the second overlay key, and the matching average value, and
    wherein the parameter comprises at least one of Final Residual 3 Sigma, Total Integrated Scatter (TIS) 3 Sigma, Registration 3 Sigma, Total Measurement Uncertainty (TMU), and a combination thereof.

2. The overlay measurement device of claim 1, wherein the controller is further configured to:
    select the optimal focus by granting a weight.

3. The overlay measurement device of claim 1, wherein the controller comprises:
    a storage configured to store the depth-specific focus images of the first overlay key and the depth-specific focus images of the second overlay key obtained by the detector according to the set value,
    a contrast index calculation device configured to determine a contrast index based on the depth-specific focus images of the first overlay key and the depth-specific focus images of the second overlay key,
    an area maximum value calculation device configured to determine the area maximum value of the first overlay key and the area maximum value of the second overlay key in which a slope in a specific area becomes 0 based on the contrast index and the depth-specific focus images of the first overlay key and the depth-specific focus images of the second overlay key,
    a candidate focus calculation device configured to determine the area maximum value of the first overlay key, the area maximum value of the second overlay key, and the matching average value which is an average value of the area maximum value of the first overlay key and the area maximum value of the second overlay key as candidate focuses, and
    an optimal focus selector configured to determine the statistical values obtained by applying the parameter to the respective candidate focuses, and grant weights to the respective statistical values to determine a candidate focus in which a sum of the statistical values becomes a minimum as the optimal focus.

4. The overlay measurement device of claim 1, wherein the controller comprises a lens operator configured to control the lens focus actuator to obtain focus images of the first layer and the second layer by depth based on the set value.

5. An overlay measurement method comprising:
    repeatedly measuring an overlay measurement target in which a first overlay key formed in a first layer and a second overlay key formed in a second layer stacked on an upper portion of the first layer are positioned, and obtaining depth-specific focus images of the first overlay key and depth-specific focus images of the second overlay key;
    extracting a plurality of candidate focuses by determining maximum contrast indexes of the first overlay key and the second overlay key in the depth-specific focus images of the first overlay key and the depth-specific focus images of the second overlay key; and
    selecting an optimal focus by applying a parameter to the plurality of candidate focuses,
    wherein the extracting the plurality of candidate focuses comprises:
        determining at least one area maximum value of the first overlay key and at least one area maximum value of the second overlay key in which a slope in a specific area becomes 0 from a contrast index based on the depth-specific focus images of the first overlay key and the depth-specific focus images of the second overlay key;
        determining at least one average value of the area maximum value of the first overlay key and the area maximum value of the second overlay key; and determining the area maximum value of the first overlay key, the area maximum value of the second overlay key, and the matching average value as the plurality of candidate focuses, wherein the selecting the optimal focus comprises:
determining statistical values for the respective candidate focuses by applying the parameter to the plurality of candidate focuses, the parameter comprising at least one of Final Residual 3 Sigma, Total Integrated Scatter (TIS) 3 Sigma, Registration 3 Sigma, Total Measurement Uncertainty (TMU), and a combination thereof.

6. The overlay measurement method of claim 5, wherein the measuring the overlay measurement target comprises:
directing an illumination of a light source to the overlay measurement target,
controlling a lens focus actuator to control a distance between an objective lens and the overlay measurement target and condensing the illumination on a measurement position at a point in the overlay measurement target through a lens assembly,
obtaining a focus image at the measurement position based on a beam reflected on the measurement position, and
determining focus-contrast index information storing contrast indexes for respective focuses from the depth-specific focus images of the first overlay key and the depth-specific focus images of the second overlay key.

7. The overlay measurement method of claim 6, wherein in the measuring the overlay measurement target, the controlling the lens focus actuator and the obtaining the focus image are repeated while changing a depth of the overlay measurement target based on a set value to obtain the depth-specific focus images of the first overlay key and the second overlay key.

8. The overlay measurement method of claim 5, wherein the selecting the optimal focus further comprises:
granting weights to the respective statistical values; and
selecting a value in which a sum of the statistical values to which the weights are granted becomes a minimum as the optimal focus.

9. The overlay measurement method of claim 5, further comprising:
measuring the overlay measurement target of a wafer with the optimal focus.

10. A non-transitory, computer-readable storage medium storing instructions that, when executed by at least one processor, cause the at least one processor to perform an overlay measurement method comprising:
repeatedly measuring an overlay measurement target in which a first overlay key formed in a first layer and a second overlay key formed in a second layer stacked on an upper portion of the first layer are positioned, and obtaining depth-specific focus images of the first overlay key and depth-specific focus images of the second overlay key;
extracting a plurality of candidate focuses by determining maximum contrast indexes of the first overlay key and the second overlay key in the depth-specific focus images of the first overlay key and the depth-specific focus images of the second overlay key, and
selecting an optimal focus by applying a parameter to the plurality of candidate focuses, wherein the extracting the plurality of candidate focuses comprises:
determining at least one area maximum value of the first overlay key and at least one area maximum value of the second overlay key in which a slope in a specific area becomes 0 from a contrast index based on the depth-specific focus images of the first overlay key and the depth-specific focus images of the second overlay key;
determining at least one average value of the area maximum value of the first overlay key and the area maximum value of the second overlay key; and
determining the area maximum value of the first overlay key, the area maximum value of the second overlay key, and the matching average value as the plurality of candidate focuses, and wherein the selecting the optimal focus comprises:
determining statistical values for the respective candidate focuses by applying the parameter to the plurality of candidate focuses, the parameter comprising at least one of Final Residual 3 Sigma, Total Integrated Scatter (TIS) 3 Sigma, Registration 3 Sigma, Total Measurement Uncertainty (TMU), and a combination thereof.

11. The non-transitory, computer-readable storage medium of claim 10, wherein the measuring the overlay measurement target comprises:
directing an illumination of a light source to the overlay measurement target,
controlling a lens focus actuator to control a distance between an objective lens and the overlay measurement target and condensing the illumination on a measurement position at a point in the overlay measurement target through a lens assembly,
obtaining a focus image at the measurement position based on a beam reflected on the measurement position, and
determining focus-contrast index information storing contrast indexes for respective focuses from the depth-specific focus images of the first overlay key and the depth-specific focus images of the second overlay key.

12. The non-transitory, computer-readable storage medium of claim 11, wherein in the measuring the overlay measurement target, the controlling the lens focus actuator and the obtaining the focus image are repeated while changing a depth of the overlay measurement target based on a set value to obtain the depth-specific focus images of the first overlay key and the second overlay key.

13. The non-transitory, computer-readable storage medium of claim 10, wherein the selecting the optimal focus further comprises:
granting weights to the respective statistical values; and
selecting a value in which a sum of the statistical values to which the weights are granted becomes a minimum as the optimal focus.

14. The non-transitory, computer-readable storage medium of claim 10, wherein the method further comprises:
measuring the overlay measurement target of a wafer with the optimal focus.

\* \* \* \* \*